United States Patent [19]
Arai et al.

[11] Patent Number: 5,672,072
[45] Date of Patent: Sep. 30, 1997

[54] CIRCUIT BOARD ELECTRICAL CONNECTOR

[75] Inventors: Tatsuya Arai; Yutaka Ichimura, both of Tokyo, Japan

[73] Assignee: Hirose Electric Co., Ltd., Tokyo, Japan

[21] Appl. No.: 695,953

[22] Filed: Aug. 13, 1996

Related U.S. Application Data

[63] Continuation of Ser. No. 355,172, Dec. 8, 1994, abandoned.

[30] Foreign Application Priority Data

Dec. 16, 1993 [JP] Japan ................ 5-072337 U

[51] Int. Cl.[6] ............................................. H01R 13/64
[52] U.S. Cl. ................................. 439/377; 439/160
[58] Field of Search ........................ 439/377, 152–160

[56] References Cited

U.S. PATENT DOCUMENTS

| | | | |
|---|---|---|---|
| 4,241,966 | 12/1980 | Gomez | 439/157 |
| 4,898,540 | 2/1990 | Saito | 439/153 |
| 4,990,097 | 2/1991 | Billman et al. | 439/160 |
| 5,074,800 | 12/1991 | Sasao et al. | 439/157 |
| 5,108,298 | 4/1992 | Simmel | 439/157 |
| 5,389,000 | 2/1995 | DiViesti et al. | 439/160 |
| 5,429,523 | 7/1995 | Tondreault | 439/160 |

*Primary Examiner*—Neil Abrams
*Assistant Examiner*—Brian J. Biggi
*Attorney, Agent, or Firm*—Kanesaka & Takeuchi

[57] ABSTRACT

A circuit board electrical connector includes a holding section (21); a receiving recess (23) provided in the holding section for receiving an edge portion of a circuit board; a pair of guiding sections (22) extending upwardly from opposite ends of the holding section; a pair of receiving slots (28) provided in the guiding sections for receiving opposite side portions of the circuit board for guiding the circuit board in direction of thickness of the circuit board; and a pair of guide plates (32) provided within the guiding section and having an elastic property for making sliding contact with opposite side faces of the circuit board to guide the circuit board in widthwise direction of the circuit board.

5 Claims, 6 Drawing Sheets

5,672,072

CIRCUIT BOARD ELECTRICAL CONNECTOR

This application is a continuation of application Ser. No. 08/355,172 filed Dec. 8, 1994, abandoned.

BACKGROUND OF THE INVENTION

1. Field of the Invention

The present invention relates to electrical connectors for connecting circuit boards.

2. Description of the Related Art

Electrical connectors with a connecting recess formed in a housing so as to have contact elements therein for receiving an edge of a circuit board on which a number of connecting pads are provided in order to connect the connecting pads with the contact elements upon plugging are well known. Most of the electrical connectors have a pair of guides on opposite sides of the housing for receiving the circuit board in the connecting recess in normal posture or without tilting.

For example, FIG. 10 shows a well known electrical connector housing 50 provided with a pair of guiding sections 53 on opposite sides of a receiving recess 52 to define a pair of receiving slots 54 which communicate with the receiving recess 52 and receive opposite sides 61 of a circuit board 60.

FIG. 11 shows another housing 50 in which the receiving slots 54 are provided with tapered upper sections 55 for tolerating certain degrees of inclination of the circuit board 60 upon plugging in or out.

In the FIG. 10 connector, however, if a circuit board is plugged-in in inclined posture, the guiding sections 53 receive large forces and can be broken. Especially, if the circuit board is plugged out in inclined posture, the guiding sections 53 can be broken under effects of lever action.

In the FIG. 11 connector, if the circuit board 60 is inclined upon plugging in, an corner of the circuit board 60 abuts against the tapered section 55, making plugging-in very difficult. If electric power has been applied to the connector, a contact element can make contact with an undesired adjacent connecting pad of the circuit board 60, making a short circuit. The upper tapered sections 55 and the bottom of the recess 52 are not elastic so that the inclination of the circuit board 60 is not corrected automatically.

In addition, where a key and a key notch are provided on the housing and the circuit board, respectively, the tapered upper sections can interfere registration of these key elements.

SUMMARY OF THE INVENTION

Accordingly, it is an object of the invention to provide a circuit board electrical connector that can tolerate a certain degree of inclination of a circuit board upon plugging in and out with a function for correcting the inclination.

According to the invention there is provided a circuit board electrical connector which includes a holding section; a receiving recess provided in the holding section for receiving an edge portion of a circuit board; a pair of guiding sections extending upwardly from opposite ends of the holding section; a pair of receiving slots provided in the guiding sections for receiving opposite side portions of the circuit board for guiding the circuit board in direction of thickness of the circuit board; and a pair of guide plates provided within the guiding sections and having an elastic property for making sliding contact with opposite side faces of the circuit board to guide the circuit board in widthwise direction of the circuit board.

In operation, if a circuit board is inclined upon plugging in or out, the guide plates of the guiding sections undergo elastic deformation to tolerate the inclination. At the same time, the guide plates exert their spring force on the circuit board tending to correct the inclination. Consequently, the circuit board is plugged in or out in substantially normal posture. If the circuit board is inclined upon plugging out, the guide plates yield to tolerate the inclination so that it is easy to pull out the circuit board.

The above and other objects, features, and advantages of the invention will be more apparent from the following description when taken in conjunction with the accompanying drawings.

DESCRIPTION OF THE PREFERRED EMBODIMENT

Figure 1:
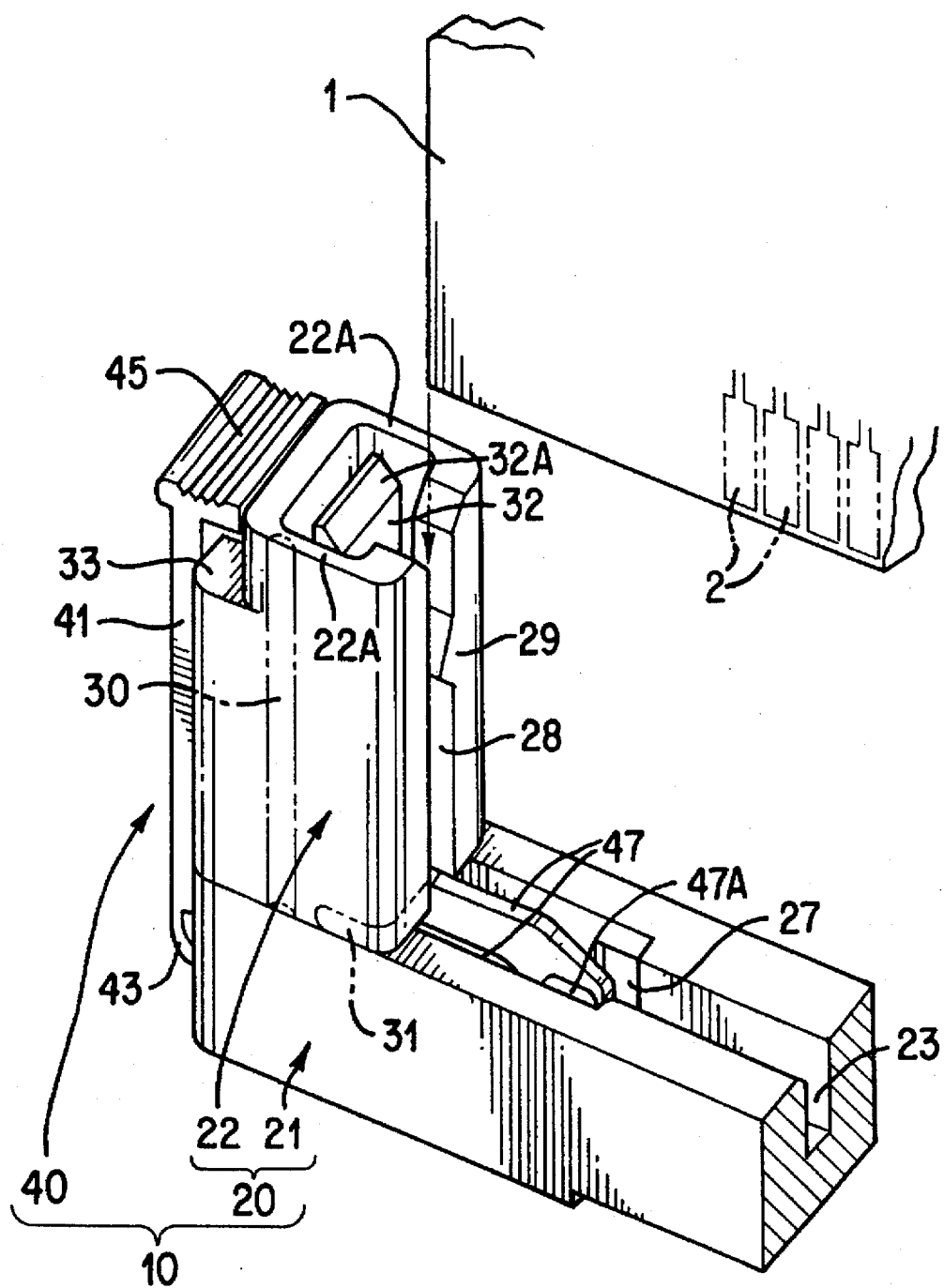
FIG. 1 is a perspective view of a portion of an electrical connector according to an embodiment of the invention.

In FIG. 1, a circuit board 1 has a number of connection pads 2 arranged on an edge thereof with a predetermined pitch.

An electrical connector 10 is designed to receive the circuit board 1. The electrical connector 10 includes a housing 20 made from an insulation material for holding the circuit board 1 such that the connection pads 2 are in contact with contact elements of the electrical connector 10 and an ejector 40 for lifting the circuit board 1 to a predetermined length that releases the connection.

The housing 20 includes an elongated holding section 21 and a pair of guiding sections 22 extending upwardly from opposite ends of the holding section 21.

Figure 2:
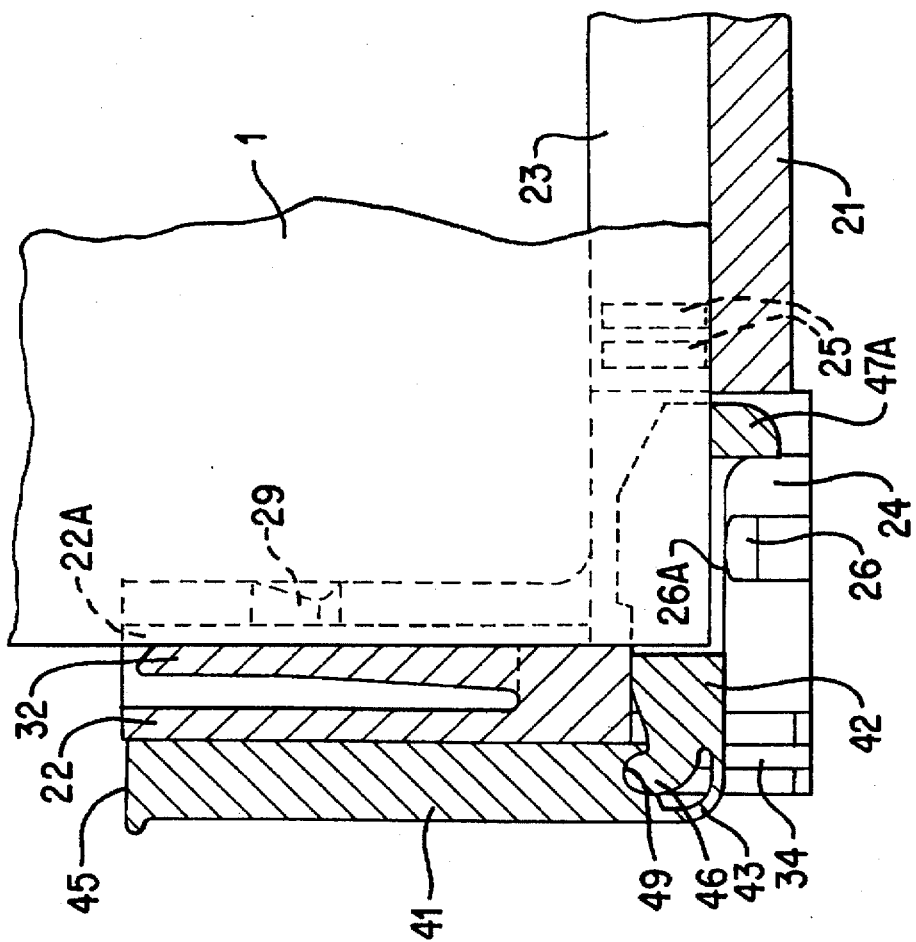
FIG. 2 is a longitudinal section of the electrical connector of FIG. 1.

In FIG. 2, the holding section 21 is provided with an elongated receiving recess 23 which communicate a pair of downward openings 24 on opposite ends thereof. A number of contact elements 25 are arranged in the receiving recess 23 between said downward openings 25 such that they come into contact with the connection pads 2 when the circuit board 1 is plugged into the receiving recess 23. Each downward opening 24 is provided with a pair of tapered projections 26 having a convex top surface 26A.

Referring back to FIG. 1, a pair of engaging recesses 27 extend downwardly between the tapered projections 26 and the contact elements 25. The guiding section 22 is provided with a pair of arm portions 22A defining a receiving slot 28 having a C-shaped cross section. The receiving slot 28 has an opening with a width greater than the thickness of the circuit board 1 and communicates with the receiving recess 23 for guiding the front edge of the circuit board into the receiving recess 23. The receiving slot 28 is provided with a projection 29 on the middle position thereof. The projection 29 has a height such that the distance between the top of the projection 29 and the opposed surface of the receiving slot 28 is slightly smaller than the thickness of the circuit board 1. The projection 29 may be provided on both sides of the receiving slot 28. In place of the projection 29, part or whole of the receiving slot may be made so that the distance between opposed surfaces is slightly smaller than the thickness of the circuit board 1. The arm portions 22A of the guiding section 22 are made thinner than the other portions so that when the circuit board 1 is fitted into the receiving slot 28, the width of the receiving slots 28 is increased elastically. In order to facilitate the elastic deformation, it is preferred to provide a groove 30 to reduce the thickness of the arm portion 22A and/or a cutout 31 on the boundary between the holding section 21 and the guiding section 22.

The guiding section 22 is provided therein with a guide plate 32 having a spring property. The base of the guide plate 32 is connected to the arm portions 22A such that the upper portion of the guide plate 32 is elastically movable in the direction of thickness. The guide plate 32 is disposed at a position such that its inside surface abuts against a side face of the circuit board 1 upon insertion and elastically flexed outwardly by the circuit board 1. The guide plate 32 is provided with a tapered upper section 32A for facilitating insertion of the circuit board 1. The fixed wall of the guiding section 22 prevents the guide plate 32 from being broken by excessive deformation.

The guiding section 22 is provided on the back side with a protruded section 33 extending upwardly from the base to the middle portion. The protruded section 33 is provided with an ejector channel 34.

Figure 3:
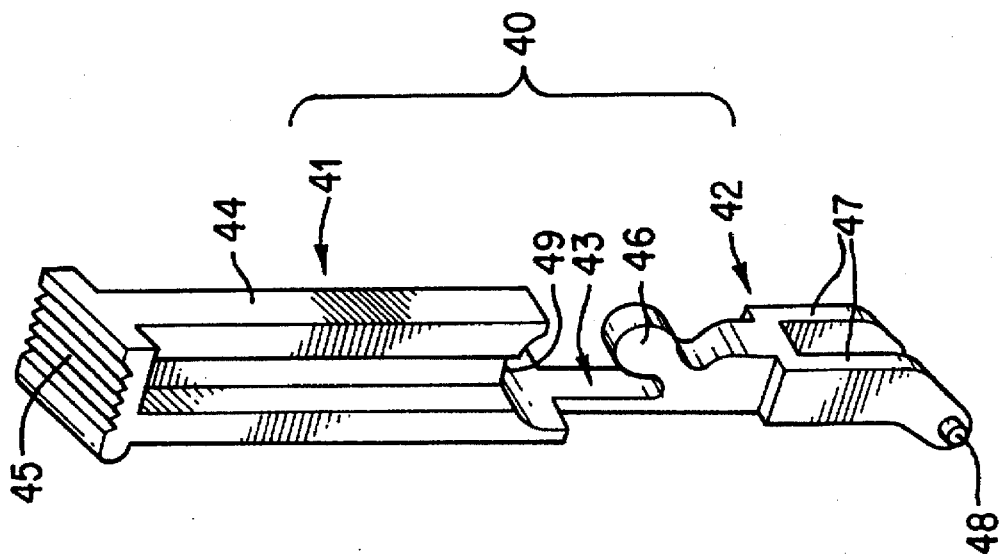
FIG. 3 is a perspective view of an ejector for the electrical connector.

In FIG. 3, an ejector 40, which is attached in the ejector channel 34 of the guiding section 22, has a slide portion 41, a finger portion 42 for ejection, and an elastic linkage portion 43 for connecting the portions 41 and 42. The slide and finger portions 41 and 42 may be made separately and then connected with a separate linkage portion.

The slide portion 41 is provided with a ridge portion 44 which is put into the ejector channel 34 for sliding movement. The slide portion 41 is provided on the top with a press portion 45 for pushing the slide portion 41 downwardly. The upper surface of the press portion 45 is serrated for preventing slippage of a finger upon pushing.

The finger portion 42 is provided with an obliquely upwardly extending cylindrical bearing 46 and below the cylindrical bearing 46 a fork portion 47 whose front ends are connected with a linking member 47A. The fork portion 47 is provided with a stopper projection 48 extending laterally from the front end. The slide portion 41 is provided on the lower end with a concave surface 49 for receiving the cylindrical bearing 46 when the ejector 40 is bent at the elastic linkage portion 43.

How to attach the ejector 40 to the housing 20 will be described below.

Figure 4:
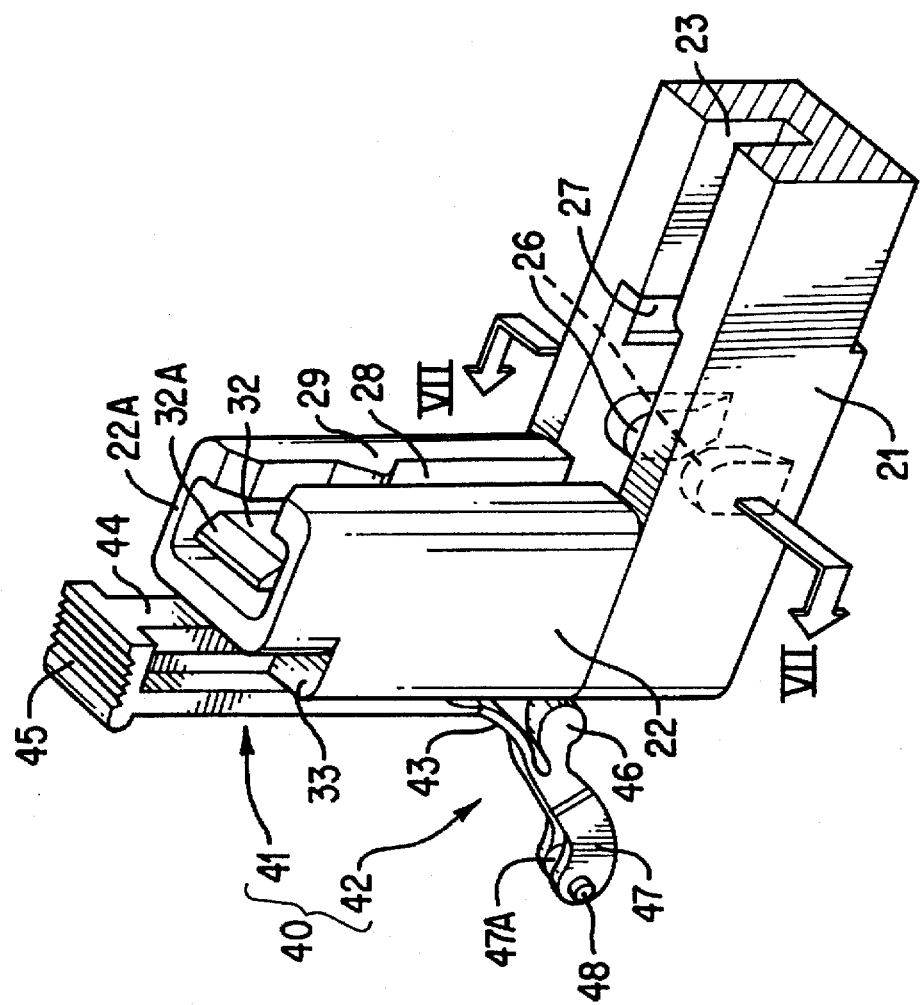
FIG. 4 is a perspective view of the electrical connector in which the slide portion of the ejector of FIG. 3 has been inserted in the housing of the connector.

(a) As shown in FIG. 4, the ridge portion 44 of the ejector 40 is put into the ejector channel 34 of the guiding section 22 from above, with the finger portion 42 bent outwardly for facilitating the insertion.

Figure 5:
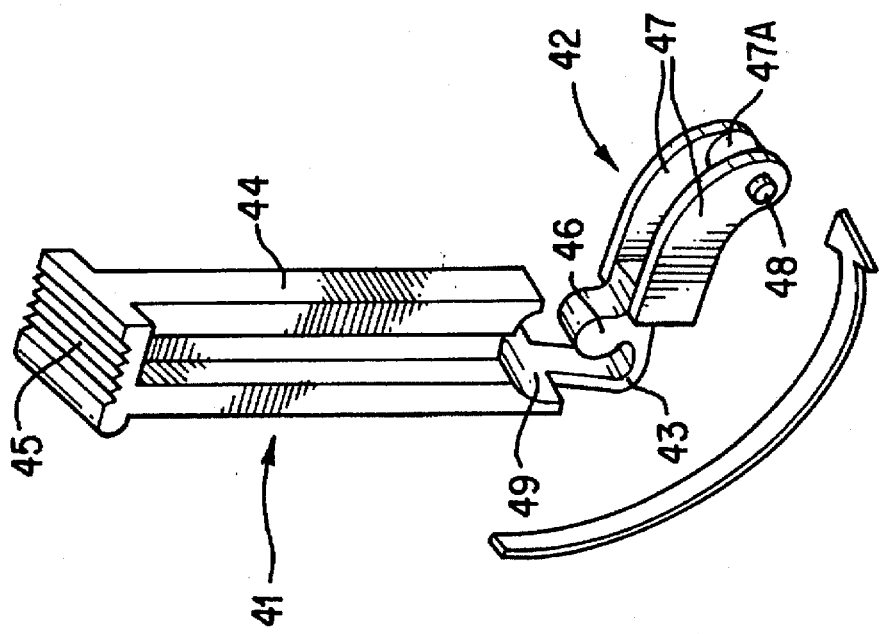
FIG. 5 is a perspective view of the ejector whose finger portion is bent at the linkage portion into the housing.

(b) As shown in FIG. 5, the finger portion 42 is bent into the housing when the ridge portion 44 is fully inserted in the ejector channel 34.

Figure 6:
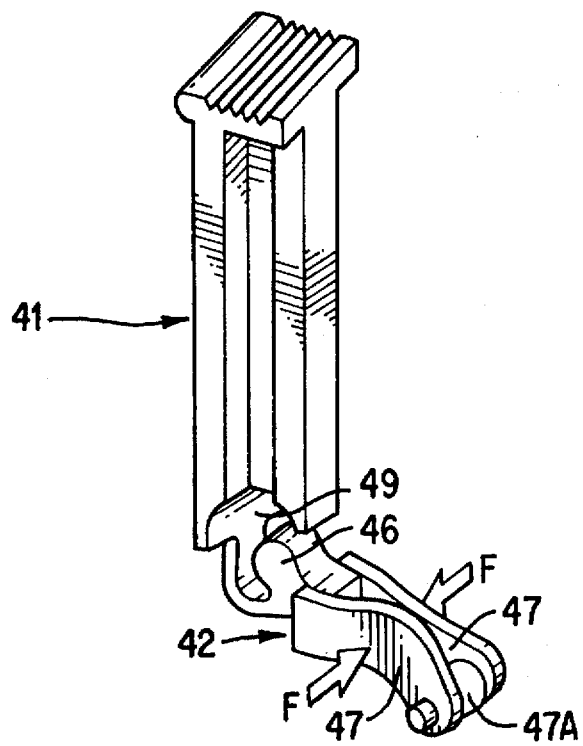
FIG. 6 is a perspective view of the ejector whose finger portion has been deformed elastically upon insertion into the housing.
Figure 7:
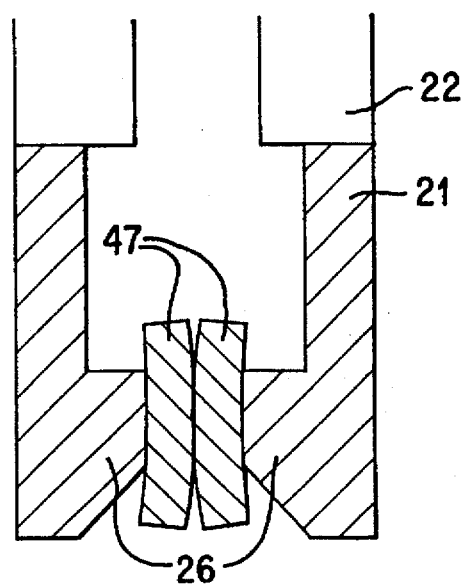
FIG. 7 is a sectional view taken along line VII—VII of FIG. 4 when the finger portion is passing the projections of the housing.
Figure 8:
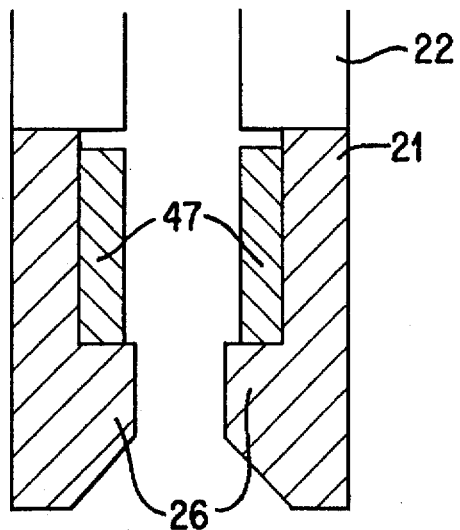
FIG. 8 is a sectional view similar to FIG. 7 when the finger portion rests at a predetermined position in the housing.

(c) As shown in FIGS. 6 and 7, when the finger portion 42 enters the opening 24 of the housing 20, the fork portion 47 is elastically deformed by the tapered projections 26. Upon passing the tapered projections 26, the fork portion 47 snaps into a space between the tapered projections 26 and the bottom of the guiding section 22 as shown in FIG. 8. At the same time, the stopper projection 48 rests in the engaging recess 27 of the holding section 21.

(d) Under this condition, the cylindrical bearing 46 of the finger portion 42 rests on the concave surface 49 of the slide portion 41 as shown in FIG. 2.

(e) The electrical connector thus assembled is ready for receiving a circuit board as described below.

(1) As shown in FIG. 1, the circuit board 1 are put into the receiving slots 28 of the guiding section 22 on opposite sides so that the circuit board 1 is guided by the spring guide plates 32 and the receiving slots 28 into a predetermined position.

(2) The lower portion of the circuit board 1 passes the projections 29 while slightly increasing the width of the receiving slots 28 and reaches the receiving recess 23 of the holding section 21 where the connection pads 2 of the circuit board 1 are connected to the corresponding contact elements 25. Under this condition, the circuit board 1 is securely held between the projection 29 and the opposed surface of the receiving slot 28.

Figure 9:
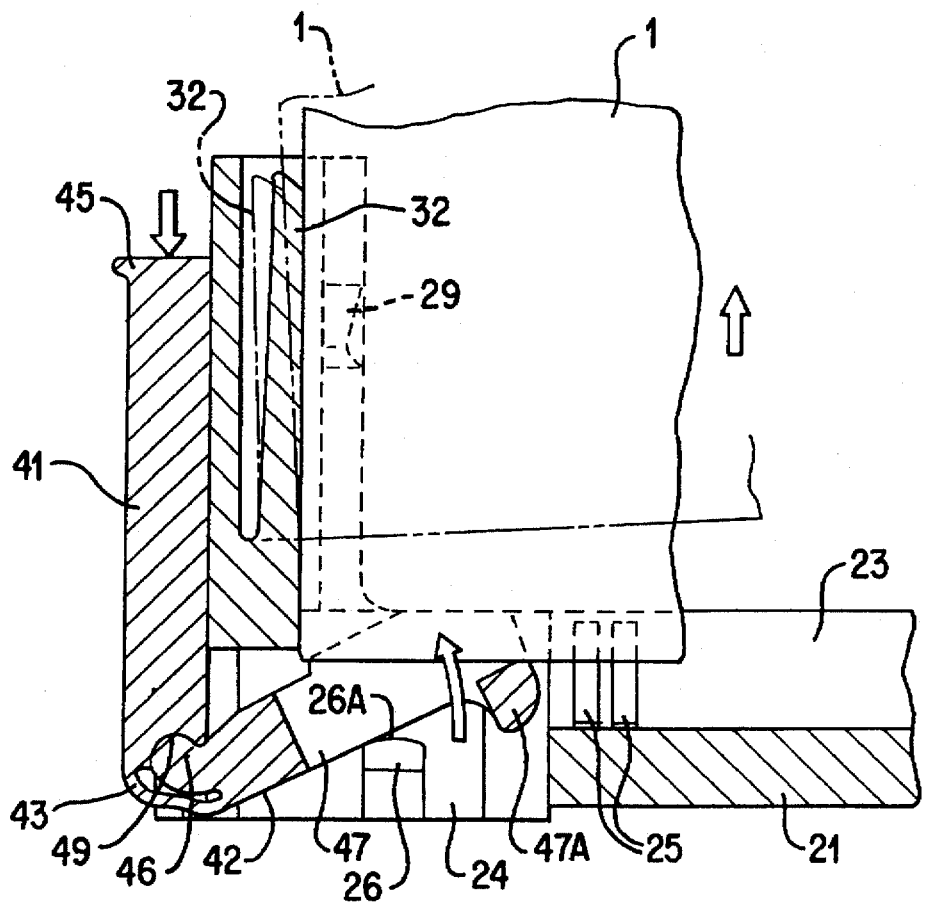
FIG. 9 is a longitudinal section of the electrical connector when a circuit board is plugged out.
Figure 10:
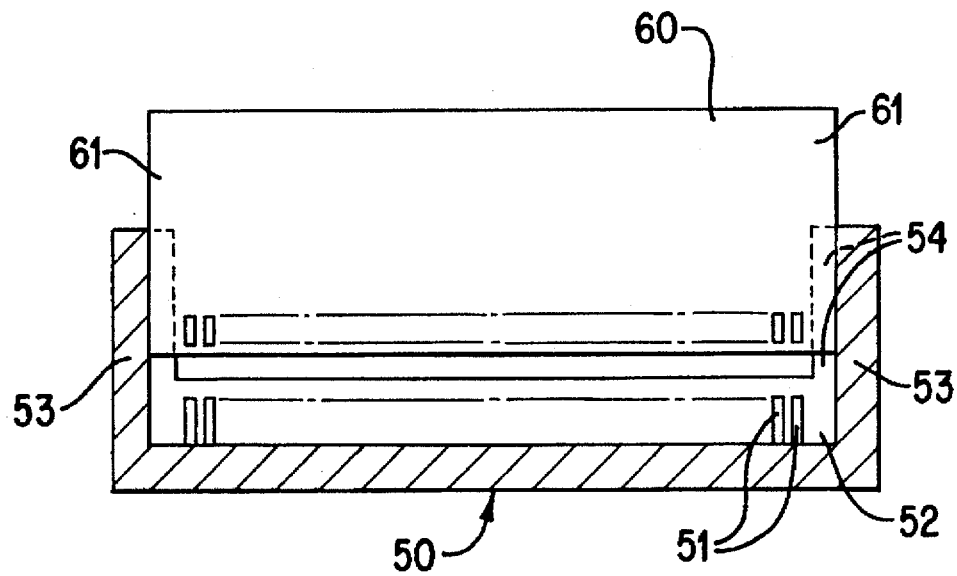
FIG. 10 is a longitudinal section of a conventional electrical connector.
Figure 11:
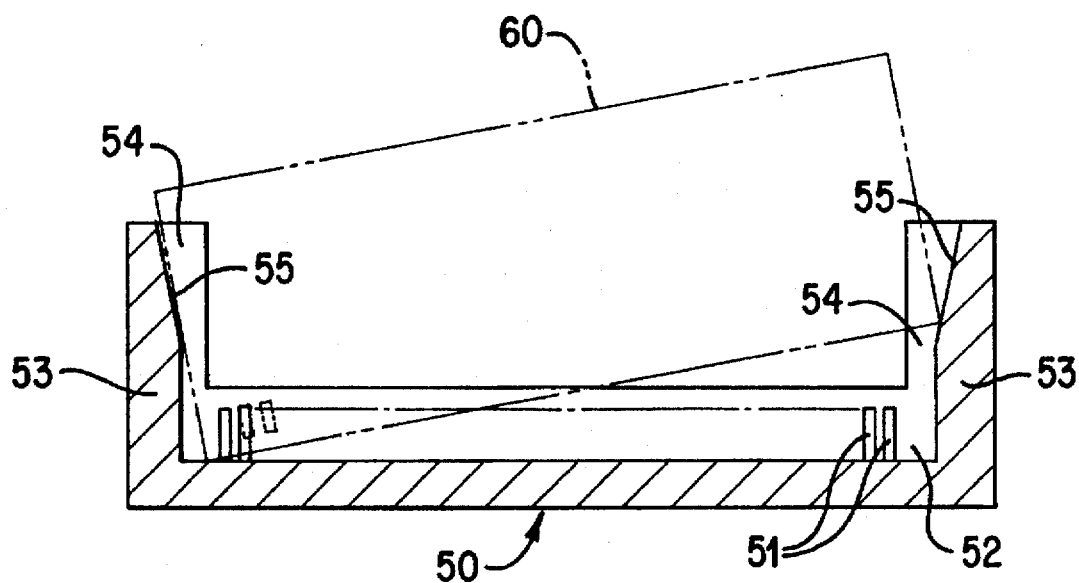
FIG. 11 is a longitudinal section of another conventional electrical connector.

(3) In order to plug out the circuit board 1, it is necessary to apply a sufficiently large force to the circuit board 1 to release the connection with the contact elements. This is done by means of the ejector 40. As shown in FIG. 9, the press portion 45 of the ejector 40 is pushed downwardly with a finger so that the slide portion 41 moves downwardly along the ejector channel 34.

(4) The concave surface 49 of the descending slide portion 41 pushes the cylindrical bearing 46 downwardly, turning the finger portion 42 counterclockwise about the projection 26 so that the front end of the finger portion 42 and the fork linkage 47A are moved upwardly, which in turn lifts the circuit board 1. Thus, the circuit board 1 is released from the contact elements 25 of the connector. Since the projection 26 has the convex surface 26A, the fulcrum of the finger portion 42 moves to the left with rotation; i.e., the arm length of moment on the circuit board 1 is increased gradually. This is desirable because the force for releasing the connection is large initially owing to the smaller arm length and then is decreased with rotation, but the stroke of upward movement of the circuit board is increased owing to the larger arm length.

The excessive upward movement of the finger portion 42 is prevented by the stopper projection 48 abutting against the upper edge of the engaging recess 27.

(5) The circuit board 1 thus released is ready to pull out of the connector. If the circuit board 1 is pulled out in inclined posture as shown by broken line in FIG. 9, the guide plates 32 yield outwardly, tending to correct the inclination.

(6) When the circuit board 1 is released from the contact elements 25, the finger portion 42 is returned to the original or horizontal position by the spring force of the linkage portion 43 while the slide portion 41 is returned along the ejector channel 34 to the original position. It is preferred to provide small projections on the slid portion 41 and the ejector channel 34 for engaging each other to prevent the slide portion 41 from moving beyond the original position.

As described above, the electrical connector having elastic guide plates for guiding a circuit board on both sides not only tolerates inclined insertion of a circuit board but also tends to correct the inclination, thus assuring the plugging of the circuit board in substantially normal posture.

The invention claimed is:

1. A circuit board electrical connector comprising:

a holding section;

a receiving recess provided in said holding section for receiving an edge portion of a circuit board;

a pair of guiding arms extending upwardly from opposite ends of said holding section and each having a C-shaped cross-section to provide a hollow cavity therein and define a pair of receiving slots to receive opposite side portions of said circuit board for guiding said circuit board in a direction of thickness of said circuit board; and a pair of guide plates each extending upwardly from a base to a top of said guiding arms within said hollow cavity and having an elastic property for making sliding contact with opposite side faces of said circuit board to guide said circuit board in a widthwise direction of said circuit board.

2. A circuit board electrical connector, comprising:

a holding section;

a receiving recess provided in said holding section for receiving an edge portion of a circuit board;

a pair of guiding sections extending upwardly from opposite ends of said holding section;

a pair of receiving slots provided in said guiding sections for receiving opposite side portions of said circuit board for guiding said circuit board in direction of thickness of said circuit board; and a pair of guide plates provided within said guiding sections and having an elastic property for making sliding contact with opposite side faces of said circuit board to guide said circuit board in widthwise direction of said circuit board, wherein said guiding sections have a pair of arm portions forming a C-shaped cross section around one of said guide plates, with opposed surfaces thereof defining an opening which serves as one of said receiving slots.

3. A circuit board electrical connector comprising:

a holding section;

a receiving recess provided in said holding section for receiving an edge portion of a circuit board;

a pair of guiding sections extending upwardly from opposite ends of said holding section;

a pair of receiving slots provided in said guiding sections for receiving opposite side portions of said circuit board for guiding said circuit board in direction of thickness of said circuit board; and a pair of guide plates provided within said guiding sections and having an elastic property for making sliding contact with opposite side faces of said circuit board to guide said circuit board in widthwise direction of said circuit board, wherein said guiding sections have a pair of arm portions forming a C-shaped cross section, with opposed surfaces thereof defining an opening which serves as one of said receiving slots, and said receiving slots are provided with a pressure portion having a sufficiently small width to elastically press at least a part of said circuit board.

4. A circuit board electrical connector according to claim 3, wherein said arm portions have a thickness smaller than that of the other portions.

5. A circuit board electrical connector according to claim 3, wherein said pressure portion is a projection.

* * * * *